United States Patent
Bouvier et al.

(10) Patent No.: US 10,937,777 B2
(45) Date of Patent: Mar. 2, 2021

(54) OPTO-ELECTRONIC DEVICE WITH LIGHT-EMITTING DIODES

(71) Applicant: Aledia, Grenoble (FR)

(72) Inventors: Christophe Bouvier, Grenoble (FR); Erwan Dornel, Fontaine (FR); Xavier Hugon, Teche (FR); Carlo Cagli, Grenoble (FR)

(73) Assignee: Aledia, Echirolles (FR)

( * ) Notice: Subject to any disclaimer, the term of this patent is extended or adjusted under 35 U.S.C. 154(b) by 0 days.

(21) Appl. No.: 16/502,443

(22) Filed: Jul. 3, 2019

(65) Prior Publication Data

US 2019/0326270 A1    Oct. 24, 2019

Related U.S. Application Data

(62) Division of application No. 14/916,983, filed as application No. PCT/FR2014/052471 on Sep. 30, 2014, now abandoned.

(30) Foreign Application Priority Data

Sep. 30, 2013   (FR) .................................... 13/59411

(51) Int. Cl.
*H01L 29/06*         (2006.01)
*H01L 25/16*         (2006.01)
(Continued)

(52) U.S. Cl.
CPC ............ *H01L 25/167* (2013.01); *H01L 27/15* (2013.01); *H01L 33/06* (2013.01); *H01L 33/08* (2013.01);
(Continued)

(58) Field of Classification Search
CPC ....... H01L 25/167; H01L 27/15; H01L 33/06; H01L 33/08; H01L 33/14; H01L 33/24; H01L 33/32; H01L 33/42
(Continued)

(56) References Cited

U.S. PATENT DOCUMENTS 3,969,746 A * 7/1976 Kendall ............ H01L 31/03529
                                                            136/255
4,774,205 A    9/1988 Choi et al.
(Continued)

FOREIGN PATENT DOCUMENTS

CN         101051634 A    10/2007
FR   10 2004 005 269 A1    6/2005
(Continued)

OTHER PUBLICATIONS

International Search Report and Written Opinion for International Application No. PCT/FR2014/052471, dated Jan. 26, 2015.
(Continued)

*Primary Examiner* — Jay C Kim
(74) *Attorney, Agent, or Firm* — Wolf, Greenfield & Sacks, P.C.

(57) ABSTRACT

An optoelectronic device including a semiconductor substrate that is optionally doped with a first type of conductivity; a first semiconductor region that is electrically connected to the substrate, doped with the first type of conductivity or a second opposite type of conductivity and more strongly doped than the substrate; a first set of first light-emitting diodes resting on the first semiconductor region, the first light-emitting diodes comprising wire-like, conical or frustoconical semiconductor elements; and a conductive portion in contact with the first semiconductor region.

12 Claims, 5 Drawing Sheets

US 10,937,777 B2
Page 2

(51) Int. Cl.
| | |
|---|---|
| *H01L 33/08* | (2010.01) |
| *H01L 33/14* | (2010.01) |
| *H01L 33/24* | (2010.01) |
| *H01L 27/15* | (2006.01) |
| *H01L 33/06* | (2010.01) |
| *H01L 33/32* | (2010.01) |
| *H01L 33/42* | (2010.01) |
| H01L 33/18 | (2010.01) |
| H05B 45/50 | (2020.01) |

(52) U.S. Cl.
CPC .............. *H01L 33/14* (2013.01); *H01L 33/24* (2013.01); *H01L 33/32* (2013.01); *H01L 33/42* (2013.01); *H01L 33/18* (2013.01); *H01L 2924/0002* (2013.01); *H05B 45/50* (2020.01)

(58) Field of Classification Search
USPC .......................................................... 257/13
See application file for complete search history.

(56) References Cited

U.S. PATENT DOCUMENTS

| | | | |
|---|---|---|---|
| 5,362,972 A | 11/1994 | Yazawa et al. | |
| 6,087,197 A * | 7/2000 | Eriguchi | B82Y 10/00 257/E21.235 |
| 6,969,897 B2 | 11/2005 | Kim, II | |
| 6,969,899 B2 * | 11/2005 | Yaung | H01L 27/1462 257/431 |
| 7,265,328 B2 * | 9/2007 | Mouli | H01L 27/14621 250/208.1 |
| 7,588,955 B2 | 9/2009 | Huang et al. | |
| 7,629,532 B2 * | 12/2009 | Kim | B82Y 20/00 136/249 |
| 7,825,032 B2 | 11/2010 | Bakkers et al. | |
| 7,847,180 B2 * | 12/2010 | Argo | B82Y 10/00 136/243 |
| 8,119,434 B2 * | 2/2012 | Cohen | B82Y 10/00 438/503 |
| 8,129,710 B2 * | 3/2012 | Cho | H01L 33/18 257/10 |
| 8,274,039 B2 | 9/2012 | Wober et al. | |
| 8,350,146 B2 * | 1/2013 | Ready | H01L 51/4213 136/256 |
| 8,384,007 B2 * | 2/2013 | Yu | H01L 27/14607 250/214.1 |
| 8,389,348 B2 | 3/2013 | Thei et al. | |
| 8,669,574 B2 | 3/2014 | Konsek et al. | |
| 8,697,552 B2 * | 4/2014 | Adibi | H01L 31/0682 438/511 |
| 8,791,470 B2 * | 7/2014 | Wober | H01L 27/15 257/80 |
| 8,816,508 B2 | 8/2014 | Liu et al. | |
| 8,847,265 B2 | 9/2014 | Lee et al. | |
| 8,932,940 B2 | 1/2015 | Wang et al. | |
| 9,054,259 B2 | 6/2015 | Hwang et al. | |
| 9,082,673 B2 | 7/2015 | Yu et al. | |
| 9,093,607 B2 | 7/2015 | Gilet et al. | |
| 9,153,545 B2 | 10/2015 | Yamamo | |
| 9,190,590 B2 | 11/2015 | Shibata et al. | |
| 9,202,954 B2 * | 12/2015 | Evelsizer | H01L 31/072 |
| 9,287,445 B2 | 3/2016 | Yoo et al. | |
| 9,304,035 B2 * | 4/2016 | Wober | B82Y 20/00 |
| 9,508,893 B2 | 11/2016 | Cha et al. | |
| 9,537,050 B2 | 1/2017 | Gilet et al. | |
| 9,608,163 B2 | 3/2017 | Cha et al. | |
| 9,627,199 B2 * | 4/2017 | Motayed | H01L 21/0259 |
| 9,768,350 B2 * | 9/2017 | Bavencove | H01L 27/153 |
| 9,793,432 B2 | 10/2017 | Kim et al. | |
| 9,876,142 B2 | 1/2018 | Bouvier et al. | |
| 10,050,080 B2 * | 8/2018 | Gilet | |
| 2003/0020132 A1 | 1/2003 | Cornett | |
| 2006/0056123 A1 | 3/2006 | Aoyagi et al. | |
| 2007/0258500 A1 | 11/2007 | Albrecht et al. | |
| 2007/0290265 A1 * | 12/2007 | Augusto | H01L 27/1203 257/351 |
| 2008/0036038 A1 | 2/2008 | Hersee et al. | |
| 2008/0116465 A1 | 5/2008 | Moon et al. | |
| 2008/0149944 A1 | 6/2008 | Samuelson et al. | |
| 2009/0321738 A1 | 12/2009 | Kim et al. | |
| 2010/0006864 A1 | 1/2010 | Steigerwaid | |
| 2011/0079796 A1 | 4/2011 | Wober | |
| 2011/0127490 A1 * | 6/2011 | Mi | H01L 21/0262 257/13 |
| 2011/0260210 A1 | 10/2011 | Su | |
| 2011/0297214 A1 * | 12/2011 | Kim | H01L 31/035281 136/255 |
| 2011/0315988 A1 | 12/2011 | Yu et al. | |
| 2012/0061646 A1 | 3/2012 | Yi et al. | |
| 2012/0061660 A1 | 3/2012 | Lu et al. | |
| 2013/0248817 A1 | 9/2013 | Kim | |
| 2014/0077156 A1 | 3/2014 | Bavencove et al. | |
| 2016/0104743 A1 | 4/2016 | Tchelnokov et al. | |

FOREIGN PATENT DOCUMENTS

| | | |
|---|---|---|
| JP | 2002-359402 A | 12/2002 |
| JP | 2009-105182 A | 5/2009 |
| JP | 2009-542560 A | 12/2009 |
| WO | WO 2010/014032 | 2/2010 |

OTHER PUBLICATIONS

International Preliminary Report on Patentability for International Application No. PCT/FR2014/052471, dated Apr. 14, 2016.

Arafin et al., Review of recent progress of III-nitride nanowire lasers. Journal of Nanophotonics. Sep. 2013;7(1):074599.

Chesiin et al., Comparing directed efficiency of III-nitride nanowire light emitting diodes. Journal of Nanophotonics. Feb. 2014;8(1):083095.

Deshpande et al., Electrically driven polarized single-photon emission from an InGaN quantum dot in a GaN nanowire. Nature communications. Apr. 9, 2013;4:1675.

Guo et al., InGaN/GaN disk-in-nanowire white light emitting diodes on (001) silicon. Applied Physics Letters. 2011,98:193102.

Han et al., Effect of annealing treatment on electroluminescence from GaN/Si nanoheterostructure array. Optics express. Feb. 27, 2012;20(5):5636-43.

Kazior, Beyond CMOS: heterogeneous integration of III-V devices, RF MEMS and other dissimilar materials/devices with Si CMOS to create intelligent microsystems. Philosophical Transactions of the Royal Society A. 2014;372:20130105.

Kishino et al., GaN nanocolumn light-emitters, growth, and optical characterization. 2013 IEEE Conference on Lasers nad Electro-Optics Pacific Rim (CLEO-PR). 2013:1-2.

Kishino et al., Selective-area growth of GaN nanocolumns on titanium-mask-patterned silicon (1 1 1) substrates by RF-plasma-assisted molecular-beam epitaxy. Electronic Letters. Jun. 19, 2008,44(13):819-21.

Mi et al., High power phosphor-free InGaN/GaN/AlGaN core-shell nanowire whit:e light emitting diodes on Si substrates. ECS Transactions. Mar. 25, 2014;1(5):9-15.

Nguyen et al., Temperature-dependent nonradiative recombination processes in GaN-based nanowire white-light-emitting diodes on silicon. Nanotechnology. Apr. 27, 2012;23(19):194012.

Park et al., Kissinger S, Lee CR. Vertically p--n-junctioned GaN nano-wire array diode fabricated on Si (1 1 1) using MOCVD. Nanoscale. 2013;5(7):2959-66.

Ra et al,. Different characteristics of InGaN/GaN multiple quantum well heterostructures grown on m-and r-planes of a single n-GaN nanowire using metalorganic chemical vapor deposition. Journal of Materials Chemistry C. 2014;2(15):2692-701.

Ra et al., Growth characteristics of uniaxial InGaN/GaN MQW/n-GaN nanowires on Si (1 1 1) using MOCVD. CrystEngComm. 2012:14(23):8208-14.

Ra et al., Radial growth behavior and characteristics of m-plane In 0.16 Ga 0.84 N/GaN MQW nanowires by MOCVD. CrystEngComm. 2013;15(10):1874-81 .

(56) References Cited

OTHER PUBLICATIONS

Salomon et al., Metal organic vapour-phase epitaxy growth of GaN wires on Si (1 1 1) for light-emitting diode applications. Nanoscale research letters. Dec. 2013;8(1):61.
Sang et al., A comprehensive review of semiconductor ultraviolet photodetectors: from thin film to one-dimensional nanostructures. Sensors. Aug. 2013;13(8):10482-518.
Shih et al., Negative Differential Resistance in GaN/AlN Heterostructure Nanowires. International Journal of Theoretical and Applied Nanotechnology. 2012;1(1):105-10.
Wang et al., Color-runable, phosphor-free InGaN nanowire light-emitting diode arrays monolithically integrated on silicon. Optics Express 2014;22(57):A1768.
Wang et al., Highly efficient, spectrally pure 340 nm ultraviolet emission from $Al_xGa_{1-x}N$ nanowire based light emitting diodes. Nanotechnology. 2013;24:345201.
Wildeson et al., III-nitride nanopyramid light emitting diodes grown by organometallic vapor phase epitaxy. Journal of Applied Physics, 2010;108:044303.
Zhao et al., Growth of large-scale vertically aligned GaN narrowires and their hetrostructures with high uniformity on SiOx by catalyst-free molecular beam epitaxy. Nanoscale. 2013;5:5283-7.
Office Action for Korean Application No. 10-2016-7007895, dated Oct. 15, 2020.
KR10-2016-7007895, dated Oct. 15, 2020, Office Action.
U.S. Appl. No. 14/916,983, filed Mar. 4, 2016, Bouvier et al.
PCT/FR2014/052471, dated Jan. 26, 2015, International Search Report and Written Opinion.
PCT/FR2014/052471, dated Apr. 14, 2016, International Preliminary Report on Patentability.

\* cited by examiner

OPTO-ELECTRONIC DEVICE WITH LIGHT-EMITTING DIODES

This application is a Division of U.S. application Ser. No. 14/916,983, filed Mar. 4, 2016, which is a national stage filing under 35 U.S.C. 371 of International Patent Application Serial No. PCT/FR2014/052471, filed Sep. 30, 2014, which claims priority to French application FR13/59411. Each of these applications is fully incorporated herein by reference.

BACKGROUND

The present invention generally relates to optoelectronic devices based on semiconductor materials and to methods for manufacturing the same. The present invention more specifically relates to optoelectronic devices comprising light-emitting diodes formed by three-dimensional elements, particularly semiconductor microwires or nanowires.

DISCUSSION OF THE RELATED ART

Phrase "optoelectronic devices with light-emitting diodes" designates devices capable of converting an electric signal into an electromagnetic radiation, and particularly devices dedicated to the emission of an electromagnetic radiation, particularly light. Examples of three-dimensional elements capable of forming light-emitting diodes are microwires or nanowires comprising a semiconductor material based on a compound mainly comprising at least one group-III element and one group-V element (for example, gallium nitride GaN), called III-V compound hereafter, or mainly comprising at least one group-II element and one group-VI element (for example, zinc oxide ZnO), called II-VI compound hereafter.

The three-dimensional elements, particularly semiconductor microwires or nanowires, of a plurality of optoelectronic devices may be formed on a substrate which is then sawn to delimit individual optoelectronic devices. Each optoelectronic device is then arranged in a package, particularly to protect the three-dimensional elements, and the package is attached to a support, for example, a printed circuit.

It may be desirable to associate an electronic circuit to the optoelectronic device. It for example is a circuit for controlling the power supply of light-emitting diodes, a circuit for protecting light-emitting diodes against electrostatic discharges, or a circuit for detecting the temperature of light-emitting diodes. Such electronic circuits are formed separately from the optoelectronic device, and then attached to the support and connected to the package. The bulk due to electronic circuits associated with the optoelectronic device may be significant. The method of manufacturing an electronic circuit comprising the optoelectronic device thus comprises, in addition to the steps of manufacturing the optoelectronic device, distinct electronic circuit manufacturing steps and steps of connecting the electronic circuits to the optoelectronic devices. These steps increase the manufacturing cost of the optoelectronic system.

SUMMARY

Thus, an object of an embodiment is to overcome at least part of the disadvantages of previously-described optoelectronic devices with light-emitting diodes, particularly with microwires or nanowires, and of their manufacturing methods.

Another object of an embodiment is to decrease the bulk of an electronic system comprising an optoelectronic device.

Another object of an embodiment is to decrease the bulk of an electronic system comprising an optoelectronic device.

Another object of an embodiment is for optoelectronic devices with light-emitting diodes to be capable of being manufactured at an industrial scale and at a low cost.

Thus, an embodiment provides an optoelectronic device comprising:

a semiconductor substrate, non-doped or doped with a first conductivity type;

a first doped semiconductor region electrically connected to the substrate, of the first conductivity type or of a second conductivity type opposite to the first type, and more heavily doped than the substrate;

a first assembly of first light-emitting diodes supported by the first semiconductor region, the first light-emitting diodes comprising wire, conical, or tapered semiconductor elements; and a conductive portion in contact with the first semiconductor region.

According to an embodiment, the first semiconductor region is obtained by one or a plurality of ion implantation steps.

According to an embodiment, the first semiconductor region is obtained by a homoepitaxy step.

According to an embodiment, the device further comprises a first electrode layer, at least partially transparent, covering each first light-emitting diode, and a first conductive layer covering the first electrode layer around the first light-emitting diodes.

According to an embodiment, the device further comprises at least one insulating portion extending along at least one lateral edge of the first semiconductor region.

According to an embodiment, the device further comprises at least one second doped semiconductor region of a conductivity type opposite to that of the first semiconductor region and extending along at least one lateral edge of the first semiconductor region.

According to an embodiment, the substrate is monolithic.

According to an embodiment, the substrate is divided into a semiconductor layer, containing the first semiconductor region, and separated from the rest of the substrate by an insulating layer.

According to an embodiment, the semiconductor layer is selected from the group comprising silicon, germanium, silicon carbide, and III-V compounds.

According to an embodiment, the substrate is selected from the group comprising silicon, germanium, silicon carbide, and III-V compounds.

According to an embodiment, the substrate is an insulating material, for example, silicon oxide or aluminum oxide.

According to an embodiment, the dopant concentration of the substrate is smaller than or equal to 1015 atoms/cm$^3$ and the dopant concentration of the first semiconductor region is in the range from 5*1016 to 2*1020 atoms/cm$^3$.

According to an embodiment, the device further comprises at least one electronic component formed at least partly in the substrate.

According to an embodiment, the electronic component belongs to the group comprising a diode, a zener diode, an avalanche diode, a bipolar transistor, a metal-oxide-semiconductor field-effect transistor, a resistor, a metal-oxide-semiconductor capacitance, a metal-insulator-metal capacitance, a thyristor, a varactor, a volatile memory, and a non-volatile memory.

According to an embodiment, the device comprises:
a third doped semiconductor region electrically connected to the substrate, of the first conductivity type or of a second conductivity type opposite to the first type, and more heavily doped than the substrate;
a second assembly of light-emitting diodes supported by the third semiconductor region, the light-emitting diodes of the second assembly comprising wire, conical, or tapered semiconductor elements; and
a second electrode layer covering each second light-emitting diode and a second conductive layer covering the second electrode layer around the first light-emitting diodes, the second electrode layer or the second conductive layer being in contact with the first semiconductor region.

According to an embodiment, the device comprises a fourth semiconductor region electrically connected to the substrate and distant from the first semiconductor region, of the same conductivity type as the first semiconductor region, more heavily doped than the substrate, and connected to an electrode of the first light-emitting diodes.

According to an embodiment, the device comprises a fifth semiconductor region containing the fourth semiconductor region.

According to an embodiment, the fifth semiconductor region further contains the first semiconductor region.

According to an embodiment, the device comprises:
a sixth semiconductor region electrically connected to the substrate, of the same conductivity type as the first semiconductor region;
a seventh semiconductor region electrically connected to the substrate, of a conductivity type opposite to that of the first semiconductor region;
an eighth semiconductor region in contact with the substrate and of the same conductivity type as the sixth semiconductor region, connected to the first semiconductor region or connected to the sixth semiconductor region; and
a ninth semiconductor region of the same conductivity type as the seventh semiconductor region,
and the ninth semiconductor region extends between the sixth and eighth semiconductor regions and is connected to the seventh semiconductor region or the ninth semiconductor region extends between the first and eighth semiconductor regions, the ninth semiconductor region being connected to the seventh semiconductor region.

According to an embodiment, the device comprises a tenth and an eleventh semiconductor regions, connected to each other, of opposite conductivity types and both separated from the first semiconductor region by at least one insulating or semiconductor portion extending along at least one lateral edge of the first semiconductor region.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figures 1, 2:
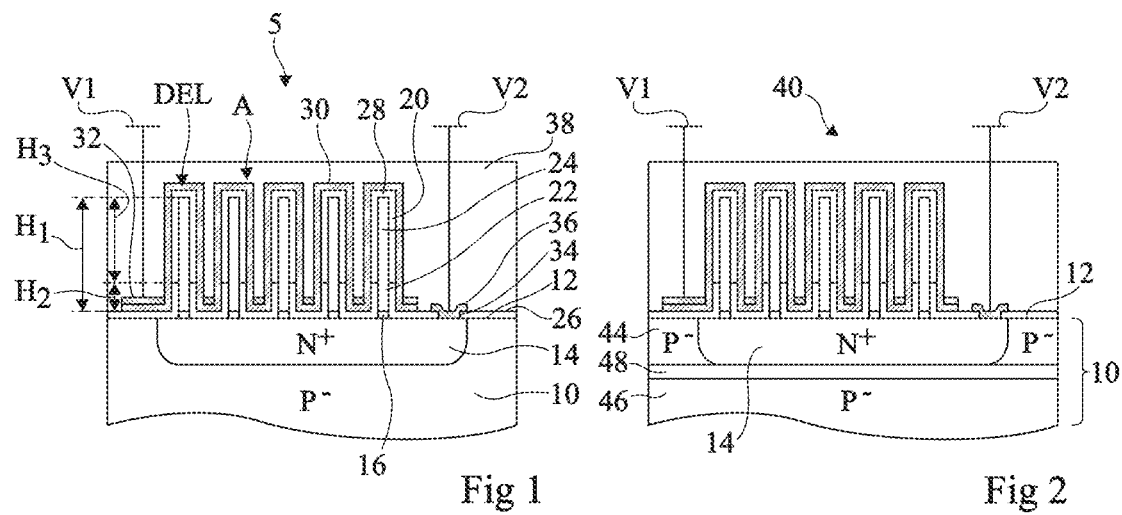
FIGS. 1 to 4 are partial simplified cross-section views of embodiments of an optoelectronic device having microwires or nanowires manufactured on a semiconductor substrate.

For clarity, the same elements have been designated with the same reference numerals in the various drawings and, further, as usual in the representation of electronic circuits, the various drawings are not to scale. Further, only those elements which are useful to the understanding of the present disclosure have been shown and will be described.

In the following description, unless otherwise indicated, terms "substantially", "approximately", and "in the order of" mean "to within 10%". Further, "compound mainly formed of a material" or "compound based on a material" means that a compound comprises a proportion greater than or equal to 95% of said material, this proportion being preferentially greater than 99%.

The present description relates to optoelectronic devices with three-dimensional elements, for example, microwires, nanowires, conical elements, or tapered elements. In the following description, embodiments are described for optoelectronic devices with microwires or nanowires. However, these embodiments may be implemented for three-dimensional elements other than microwires or nanowires, for example, pyramid-shaped three-dimensional elements.

Term "microwire" or "nanowire" designates a three-dimensional structure having an elongated shape along a preferential direction having at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest of the minor dimensions. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the average line of the wire which runs through the centers of gravity of the straight sections, in planes perpendicular to the preferential direction of the wire, is substantially rectilinear and is called "axis" of the wire hereafter.

According to an embodiment, to manufacture an optoelectronic device, a semiconductor substrate, non-doped or lightly doped with a first conductivity type is used and the light-emitting diodes are formed on a heavily-doped region of a second conductivity type opposite to the first type and extending in the substrate from the upper surface of the substrate. The substrate for example corresponds to an undoped or lightly-doped single-crystal silicon substrate conventionally used in integrated circuit manufacturing processes.

The base of the light-emitting diodes is biased by the heavily-doped region which is in contact with all the light-emitting diodes. The heavily-doped region is relatively electrically insulated from the rest of the substrate. Other electronic components may then be formed inside or on top of this substrate in integrated fashion with the light-emitting diodes. The additional electronic components may correspond to pn diodes, zener diodes, avalanche diodes, metal-oxide-semiconductor field-effect transistors, also called MOS transistors, bipolar transistors, resistors, metal-oxide-semiconductor capacitances, also called MOS capacitances, metal-insulator-metal capacitances, also called MIM capacitances, thyristors, varactors, volatile memories, for example, dynamic random access memories called DRAM, non-volatile memories, for example, flash memories.

FIG. 1 is a partial simplified cross-section view of an embodiment of an optoelectronic device 5 formed from wires such as previously described and capable of emitting an electromagnetic radiation.

FIG. 1 shows a structure comprising, from bottom to top:

a semiconductor substrate 10, non-doped or lightly-doped with a first conductivity type, comprising an upper surface 12, preferably planar at least at the level of the light-emitting diodes;

a doped region 14 of the first conductivity type or of a second conductivity type, opposite to the first type, more heavily doped than substrate 10, extending in substrate 10 from surface 12 and playing the role of a first electrode;

seed pads 16 promoting the growth of wires and arranged on surface 12 in contact with region 14;

wires 20 (five wires being shown) of height $H_1$, each wire 20 being in contact with one of seed pads 16, each wire 20 comprising a lower portion 22, of height $H_2$, in contact with seed pad 16 and an upper portion 24, of height $H_3$, continuing lower portion 22;

an insulating layer 26 extending on surface 12 of substrate 10 and on the lateral sides of lower portion 22 of each wire 20;

a shell 28 comprising a stack of semiconductor layers covering each upper portion 24;

a layer 30 forming a second electrode covering each shell 28 and further extending on insulating layer 26;

a conductive layer 32 covering electrode layer 30 between wires 20 without extending on wires 20;

an opening 34 in insulating layer 26 exposing region 14;

a pad 36 of a conductive material extending in opening 34 and on insulating layer 26 around opening 34, pad 36 being in contact with region 14 in opening 34; and an encapsulation layer 38 covering the entire structure and particularly electrode 30.

Optoelectronic device 5 may further comprise a layer of phosphors, not shown, provided on encapsulation layer 38 or confounded therewith.

The assembly formed by each wire 20, the associated seed pad 16, and shell 28 forms a light-emitting diode DEL. The base of diode DEL corresponds to seed pad 16. Shell 28 particularly comprises an active layer which is the layer from which the majority of the electromagnetic radiation delivered by light-emitting diode DEL is emitted. Light-emitting diodes DEL are connected in parallel and form an assembly A of light-emitting diodes. Assembly A may comprise from a few light-emitting diodes DEL to one thousand light-emitting diodes.

In the present embodiment, semiconductor substrate 10 corresponds to a monolithic structure. Semiconductor substrate 10 for example is a substrate made of silicon, of germanium, of silicon carbide, of a III-V compound, such as GaN or GaAs, or a ZnO substrate. Preferably, substrate 10 is a single-crystal silicon substrate.

Substrate 10 is non-doped or lightly-doped with a dopant concentration smaller than or equal to $5*10^{16}$ atoms/cm$^3$, preferably substantially equal to $10^{15}$ atoms/cm$^3$. Substrate 10 has a thickness in the range from 275 μm to 1.5 mm, preferably 725 μm.

In the case of a silicon substrate 10, examples of P-type dopants are boron (B) or indium (In) and examples of N-type dopants are phosphorus (P), arsenic (As), or antimony (Sb). Preferably, substrate 10 is P-type boron-doped.

Surface 12 of silicon substrate 10 may be a (100) surface.

Region 14 is a heavily-doped region. Preferably, the conductivity type of region 14 is opposite to the conductivity type of substrate 10. As an example, FIG. 1 shows a lightly-doped P-type substrate 10 and a heavily-doped N-type region 14. The dopant concentration of region 14 is in the range from $5*10^{16}$ atoms/cm$^3$ to $2*10^{20}$ atoms/cm$^3$, preferably from $3*10^{17}$V atoms/cm$^3$ to $5*10^{18}$ atoms/cm$^3$. The thickness of region 14 is in the range from 150 nm to several micrometers, preferably from 150 nm to 1 μm, more preferably from 150 nm to 400 nm.

Seed pads 16, also called seed islands, are made of a material promoting the growth of wires 20. A treatment may be provided to protect the lateral sides of the seed pads and the surface of the substrate portions which are not covered with the seed pads to prevent the wires from growing on the lateral sides of the seed pads and on the surface of the substrate portions which are not covered with the seed pads. The treatment may comprise forming a dielectric region on the lateral sides of the seed pads and extending on top of and/or inside of the substrate and connecting, for each pair of pads, one of the pads of the pair to the other pad in the pair, with no wire growth on the dielectric region. As a variation, seed pads 16 may be replaced with a seed layer covering surface 12 of substrate 10 and extending on region 14. A dielectric region may then be formed above the seed layer to prevent the growth of wires in unwanted areas.

As an example, the material forming seed pads 16 may be a nitride, a carbide, or a boride of a transition metal from column IV, V, or VI of the periodic table of elements or a combination of these compounds. As an example, seed pads 16 may be made of aluminum nitride (AlN), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB$_2$), of zirconium nitride (ZrN), of silicon carbide (SiC), of tantalum carbo-nitride (TaCN), of magnesium nitride in Mg$_x$N$_y$ form, where x is approximately equal to 3 and y is approximately equal to 2, for example, magnesium nitride in Mg$_3$N$_2$ form or magnesium gallium nitride (Mg-GaN), of tungsten (W), of tungsten nitride (WN), or of a combination thereof.

Seed pads 16 may be doped with the same conductivity type as region 14.

Insulating layer 26 may be made of a dielectric material, for example, of silicon oxide (SiO$_2$), of silicon nitride (Si$_x$N$_y$, where x is approximately equal to 3 and y is approximately equal to 4, for example, $Si_3N_4$), of silicon oxynitride ($SiO_xN_y$ where x may be approximately equal to ½ and y may be approximately equal to 1, for example, $Si_2ON_2$), of aluminum oxide ($Al_2O_3$), of hafnium oxide ($HfO_2$), or of diamond. As an example, the thickness of insulating layer 26 is in the range from 5 nm to 800 nm, for example, equal to approximately 30 nm.

Wires 20 are at least partly formed from at least one semiconductor material. The semiconductor material may be silicon, germanium, silicon carbide, a III-V compound, a II-VI compound, or a combination of these compounds.

Wires 20 may be at least partly formed of semiconductor materials mainly comprising a III-V compound, for example, III-N compounds. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions.

Wires 20 may be at least partly formed from semiconductor materials mainly comprising a II-VI compound. Examples of group-II elements comprise group-IIA elements, particularly beryllium (Be) and magnesium (Mg) and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

Wires 20 may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

The cross-section of wires 20 may have different shapes, such as, for example, an oval, circular, or polygonal shape, particularly triangular, rectangular, square, or hexagonal. It should thus be understood that term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section. The average diameter of each wire 20 may be in the range from 50 nm to 2.5 µm. Height H1 of each wire 20 may be in the range from 250 nm to 50 µm. Each wire 20 may have an elongated semiconductor structure along an axis substantially perpendicular to surface 12. Each wire 20 may have a general cylindrical shape. The axes of two wires 20 may be distant by from 0.5 µm to 10 µm, and preferably from 1.5 µm to 4 µm. As an example, wires 20 may be regularly distributed, particularly in a hexagonal network.

As an example, lower portion 22 of each wire 20 is mainly formed of the III-N compound, for example, gallium nitride, of same doping type as region 14, for example, type N, for example, with silicon. Lower portion 22 extends along a height H2 which may be in the range from 100 nm to 25 µm.

As an example, upper portion 24 of each wire 20 is at least partially made of a III-N compound, for example, GaN. Upper portion 24 may be N-type doped, possibly less heavily doped than lower portion 22, or not be intentionally doped. Upper portion 24 extends along a height H3 which may be in the range from 100 nm to 25 µm.

Shell 28 may comprise a stack of a plurality of layers, particularly comprising:
an active layer covering upper portion 24 of the associated wire 20;
an intermediate layer having a conductivity type opposite to that of lower portion 22 covering the active layer; and
a bonding layer covering the intermediate layer and covered with electrode 30.

The active layer is the layer from which most of the radiation delivered by light-emitting diode DEL is emitted. According to an example, the active layer may comprise confinement means, such as multiple quantum wells. It is for example formed of an alternation of GaN and of InGaN layers having respective thicknesses from 5 to 20 nm (for example, 8 nm) and from 1 to 10 nm (for example, 2.5 nm). The GaN layers may be doped, for example of type N or P. According to another example, the active layer may comprise a single InGaN layer, for example, having a thickness greater than 10 nm.

The intermediate layer, for example, P-type doped, may correspond to a semiconductor layer or to a stack of semiconductor layers and enables to form a P-N or P-I-N junction, the active layer being comprised between the intermediate P-type layer and upper N-type portion 24 of the P-N or P-I-N junction.

The bonding layer may correspond to a semiconductor layer or to a stack of semiconductor layers and enables to form an ohmic contact between the intermediate layer and electrode 30. As an example, the bonding layer may be very heavily doped, of a type opposite to that of lower portion 22 of each wire 20, until degeneration of the semiconductor layer(s), for example, P-type doped at a concentration greater than or equal to $10^{20}$ atoms/cm$^3$.

The stack of semiconductor layers may comprise an electron barrier layer formed of a ternary alloy, for example, made of aluminum gallium nitride (AlGaN) or of aluminum indium nitride (AlInN) in contact with the active layer and the intermediate layer, to provide a good distribution of electric carriers in the active layer.

Electrode 30 is capable of biasing the active layer of each wire 20 and of letting through the electromagnetic radiation emitted by light-emitting diodes DEL. The material forming electrode 30 may be a transparent and conductive material such as indium tin oxide (ITO), aluminum-doped zinc oxide, or graphene. As an example, electrode layer 30 has a thickness in the range from 5 nm to 200 nm, preferably from 20 nm to 50 nm.

Conductive layer 32 preferably corresponds to a metal layer, for example, aluminum, silver, copper, or zinc. As an example, conductive layer 32 has a thickness in the range from 20 nm to 1,000 nm, preferably from 100 nm to 200 nm.

Encapsulation layer 38 is made of an at least partially transparent insulating material. The maximum thickness of encapsulation layer 38 is in the range from 250 nm to 50 µm so that encapsulation layer 38 fully covers electrode 30 at the top of light-emitting diodes DEL. Encapsulation layer 38 may be made of an at least partially transparent inorganic material. According to an example, encapsulation layer 38 is made of silicone. According to another example, the inorganic material is selected from the group comprising silicon oxides, of type $SiO_x$ where x is a real number between 0 and 2, or $SiO_yN_z$ where y is a real number between 0 and 2 and z is between 0 and 1, and aluminum oxides, for example, $Al_2O_3$. Encapsulation layer 38 may be made of an at least partially transparent organic material. As an example, encapsulation layer 38 is an epoxide polymer.

The biasing of each light-emitting diode DEL of assembly A is obtained by connecting electrode 30 to a source V1 of a first reference voltage and by connecting pad 36 to a source V2 of a second reference voltage. As an example, in the case of N-type doped wire, the first voltage may be greater than the second voltage and source V2 may correspond to the ground.

Preferably, a plurality of optoelectronic devices with light-emitting diodes are simultaneously formed on a semiconductor substrate wafer. The number of light-emitting diodes may be different according to optoelectronic devices. The optoelectronic devices are separated by wafer sawing steps. Advantageously, it is a silicon wafer currently used in methods of circuit manufacturing in microelectronics, particularly based on metal-oxide field-effect transistors or MOS transistors.

An embodiment of a manufacturing method enabling to obtain optoelectronic device 5 comprises the steps of:

(1) Forming region 14. Region 14 may be obtained by one or more than one dopant implantation in substrate 10 or by selective epitaxy of the heavily-doped material on an initial support.

(2) Forming, on surface 12 of substrate 10, seed pads 16. Seed pads 16 may be obtained by depositing a seed layer on surface 12 and by etching portions of the seed layer all the way to surface 12 of substrate 10 to delimit the seed pads. The seed layer may be deposited by a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), hydride vapor phase epitaxy (HVPE) may be used, as well as an atomic layer deposition method (ALD). Further, methods such as evaporation or reactive cathode sputtering may be used.

When seed pads 16 are made of aluminum nitride, they may be substantially textured and have a preferred biasing. The texturing of pads 16 may be obtained by an additional treatment performed after the deposition of the seed layer. It for example is an anneal under an ammonia flow (NH3).

(3) Protecting the portions of surface 12 of substrate 10 which are not covered with seed pads 16 to avoid the subsequent growth of wires on these portions. This may be obtained by a nitriding step which causes the forming, at the surface of substrate 10, between seed pads 16, of silicon nitride regions (for example, SiN or $Si_3N_4$). This may also be obtained by a step of masking substrate 10 between seed pads 16, including the deposition of a layer, for example of a $SiO_2$ or SiN or $Si_3N_4$ dielectric, and then the etching of this layer outside of seed pads 16 after a photolithography step. In this case, the masking layer may extend over seed pads 16. When the protection step (3) is carried out by a step of masking substrate 10, the seed layer etch step may be avoided. Seed pads 16 are then formed of a uniform continuous layer having its surface left free at the level where the wires cross.

(4) Growing lower portion 22 of each wire 26 along height H2. Each wire 26 grows from the top of the underlying seed pad 16.

Wires 26 may be grown by a process of CVD, MOCVD, MBE, GSMBE, PAMBE, ALE, HVPE, ALD type. Further, electrochemical processes may be used, for example, chemical bath deposition (CBD), hydrothermal processes, liquid aerosol pyrolysis, or electrodeposition.

As an example, the wire growth method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia ($NH_3$), tertiarybutylphosphine (TBP), arsine ($AsH_3$), or unsymmetrical dimethylhydrazine (UDMH).

According to an embodiment of the invention, in a first phase of growth of the wires of the III-V compound, a precursor of an additional element is added in excess, in addition to the precursors of the III-V compound. The additional element may be silicon (Si). An example of precursor of silicon is silane ($SiH_4$).

The presence of silane among precursor gases causes the incorporation of silicon within the GaN compound. A lower N-type doped portion 22 is thus obtained. This further translates as the forming of a silicon nitride layer, not shown, which covers the periphery of portion 22 of height $H_2$, except for the top, as portion 22 grows.

(5) Growing upper portion 24 of height H3 of each wire 20 on the top of lower portion 22. For the growth of upper portion 24, the previously-described operating conditions of the MOCVD reactor are, as an example, maintained but for the fact that the silane flow in the reactor is decreased, for example, by a factor greater than or equal to 10, or stopped. Even when the silane flow is stopped, upper portion 24 may be N-type doped due to the diffusion in this active portion of dopants originating from the adjacent passivated portion or due to the residual doping of GaN.

(6) Forming by epitaxy, for each wire 20, the layers forming shell 28. Given the presence of the silicon nitride layer covering the periphery of lower portion 22, the deposition of the layers forming shell 28 only occurs on the upper portion 24 of wire 20 which is not covered with the silicon nitride layer.

(7) Forming insulating layer 26, for example, by conformally depositing an insulating layer over the entire structure obtained at step (6) and etching this layer to expose shell 28 of each wire 20. In the previously-described embodiment, insulating layer 26 does not cover shell 28. As a variation, insulating layer 26 may cover a portion of shell 28. Further, insulating layer 26 may be formed before shell 28.

(8) Forming electrode 30, for example, by conformal deposition.

(9) Forming conductive layer 32 for example by physical vapor deposition (PVD) over the entire structure obtained at step (8) or for example by evaporation or by cathode sputtering and etching of this layer to expose each wire 20;

(10) Forming encapsulation layer 38. When encapsulation layer 38 is made of silicone, encapsulation layer 38 may be deposited by a spin coating deposition method, by an inkjet printing method, or by a silk-screening method. When encapsulation layer 38 is an oxide, it may be deposited by CVD; and

(11) Sawing substrate 10 to separate the optoelectronic devices.

In the previously-described embodiment, region 14 is formed before wires 20. As a variation, region 14 may be formed, particularly by implantation, after wires 20.

FIG. 2 is a partial simplified cross-section view of an optoelectronic device 40 according to another embodiment.

Optoelectronic device 40 comprises all the elements of optoelectronic device 5 shown in FIG. 1, with the difference that monolithic substrate 10 corresponds to a multilayer of silicon-on-insulator or SOI type. Substrate 10 comprises a layer 44 of a semiconductor material separated from a support 46 by an insulating layer 48. Surface 12 corresponds to the upper surface of semiconductor layer 44.

Semiconductor layer 44 may be made of the same material as substrate 10. In particular, semiconductor layer 44 is lightly doped. As an example, the thickness of semiconductor layer 44 is in the range from 10 nm to 1 µm. Insulating layer 48 corresponds, for example, to an oxide or to a nitride. As an example, the thickness of insulating layer 48 is in the range from 10 nm to 300 nm. Support 46 may be a semiconductor or insulating material. When support 46 corresponds to an insulating material, insulating layer 48 and support 46 may be confounded.

Region 14 extends in semiconductor layer 44 from surface 12, for example, over the entire thickness of the semiconductor layer 44. Optoelectronic device 40 has the advantage, over optoelectronic device 5, of suppressing leakage currents from region 14 to support 46.

Figures 3, 4:
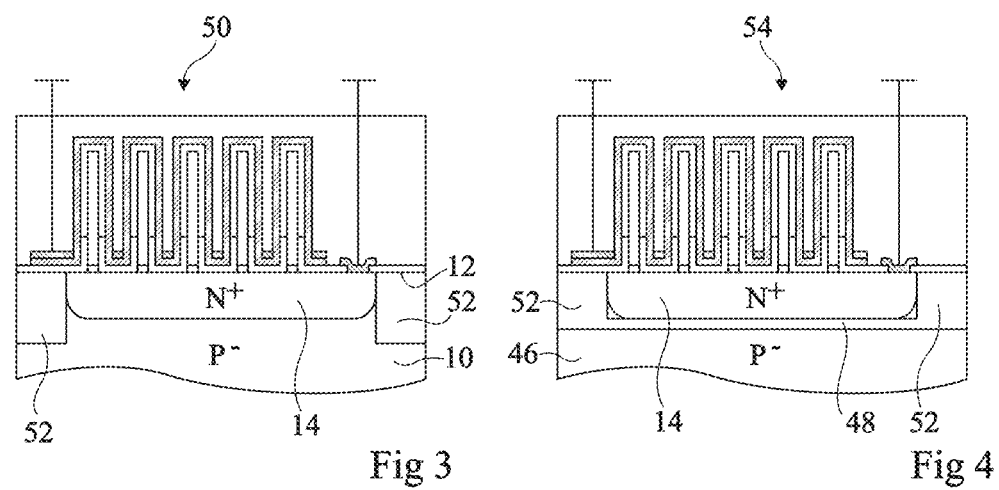

FIG. 3 is a partial simplified cross-section view of an optoelectronic device 50 according to another embodiment. Optoelectronic device 50 comprises all the elements of optoelectronic device 5 shown in FIG. 1 and further comprises insulating regions 52 at least partly extending in substrate 10, at least partly around heavily-doped region 14. Although this has not been shown in FIG. 3, insulating regions 52 may further protrude from surface 12.

Each insulating region 52 may extend in substrate 10 from surface 12 down to a depth in the range from 60 nm to 800 nm, preferably 150 nm. As an example, insulating regions 52 are made of silicon oxide or of silicon nitride. Insulating regions 52 may be formed by a shallow-trench insulation type (STI) trench forming method. Optoelectronic device 50 has the advantage over optoelectronic device 5 of suppressing lateral leakage currents from region 14.

FIG. 4 is a partial simplified cross-section view of an optoelectronic device 54 comprising both insulating layer 48 of optoelectronic device 40 shown in FIG. 2 and insulating regions 52 of optoelectronic device 50 shown in FIG. 3. Optoelectronic device 54 has the advantage over optoelectronic device 5 of suppressing lateral leakage currents from region 14 and leakage currents from region 14 to support 46.

The base of light-emitting diodes DEL is biased by heavily-doped region 14, which may be electrically insulated from the rest of substrate 10. A plurality of heavily-doped regions may thus be formed in substrate, such heavily-doped regions being associated with different assemblies of light-emitting diodes.

Figure 5:
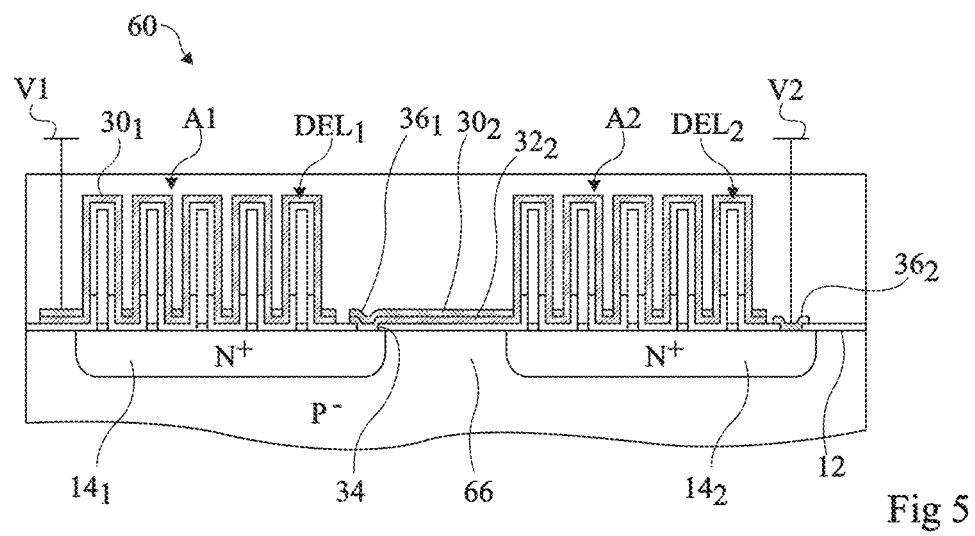
FIGS. 5 to 9 are partial simplified cross-section views of embodiments of an optoelectronic device comprising two assemblies of series-connected light-emitting diodes.

FIG. 5 is a cross-section view of an optoelectronic device 60 which comprises two assemblies A1, A2 of light-emitting diodes DEL. Each assembly A1, A2 of light-emitting diodes may have the same structure as that shown in FIG. 1. In FIG. 5, index "1" has been added to the reference numerals of the elements associated with assembly A1 and index "2" has been added to the reference numerals of the elements associated with assembly A2. In particular, the bases of the light-emitting diodes of each assembly A1, A2 are in contact with a heavily-doped region 14. The heavily-doped region 14$_1$ associated with assembly A1 of light-emitting diodes is separated by heavily-doped region 14$_2$ associated with assembly A2 of light-emitting diodes by a lightly-doped portion 66 of substrate 10. Preferably, the minimum distance separating the two adjacent heavily-doped regions 14$_1$, 14$_2$ is greater than 2 µm, preferably in the range from 2 µm to 10 µm.

In the present embodiment, assembly A1 of light-emitting diodes is series-connected with assembly A2 of light-emitting diodes. For this purpose, electrode 30$_2$ and conductive layer 32$_2$ of assembly A2 of light-emitting diodes DEL$_2$ extend all the way to opening 34$_1$ to form contact pad 36$_1$ of assembly A1 and come into contact with heavily-doped region 14$_1$ of assembly A1.

Electrode 30$_1$ of assembly A1 of light-emitting diodes is connected to source V1 of the first reference voltage and contact pad 36$_2$ of assembly A2 of light-emitting diodes is connected to source V2 of the second reference voltage.

FIG. 5 shows an optoelectronic device 60 comprising two assemblies A1, A2 of light-emitting diodes arranged in series. The number of assemblies of series-connected light-emitting diodes may be larger. Optoelectronic device 60 may comprise from 2 to more than 100 assemblies of series-connected light-emitting diodes. The association of assemblies of series-connected light-emitting diodes enables to increase the maximum amplitude of the power supply voltage applied to the assemblies of light-emitting diodes, which is equal to the difference between the first and second reference voltages delivered by sources V1 and V2. As an example, the power supply voltage may have a maximum amplitude greater than or equal to 6 V, for example, approximately 12 V, 24 V, 48 V, 110 V, or 240 V.

Figure 6:
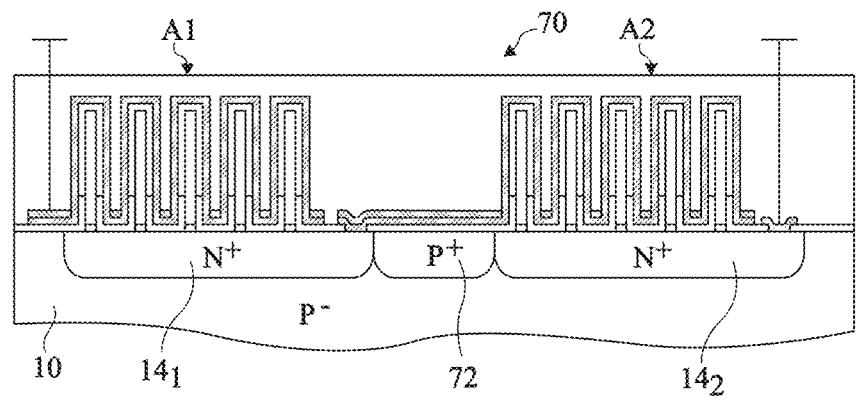

FIG. 6 is a cross-section view of an optoelectronic device 70 according to another embodiment. Optoelectronic device 70 comprises all the elements of optoelectronic device 60 shown in FIG. 5 and further comprises a heavily-doped region 72 extending in substrate 10 from surface 12 and arranged between heavily-doped region 14$_1$ associated with assembly A1 and heavily-doped region 14$_2$ associated with assembly A2. Heavily-doped region 72 has a conductivity type opposite to that of heavily-doped regions 14$_1$, 14$_2$. The dopant concentration of region 72 is in the range from $5*10^{16}$ atoms/cm$^3$ to $2*10^{20}$ atoms/cm$^3$, preferably from $3*10^{17}$ atoms/cm$^3$ to $5*10^{18}$ atoms/cm$^3$. Region 72 enables to improve the electric insulation between regions 14$_1$, 14$_2$.

Figure 7:
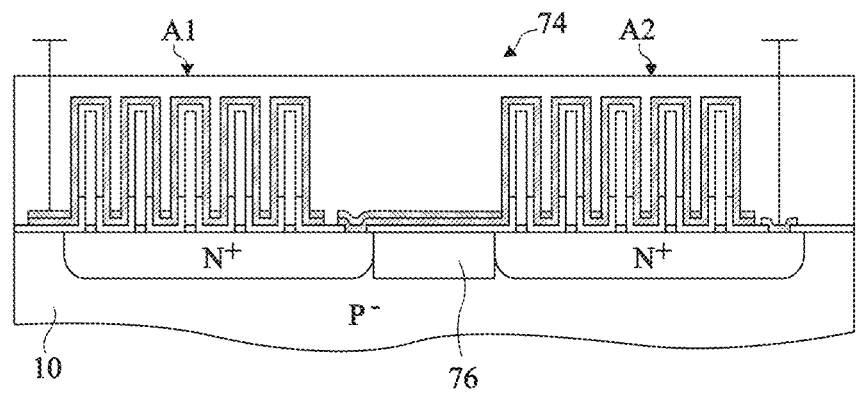

FIG. 7 is a cross-section view of an optoelectronic device 74 according to another embodiment. Optoelectronic device 74 comprises all the elements of optoelectronic device 72 shown in FIG. 6, with the difference that heavily-doped region 72 is replaced with an insulating region 76 which may be identical to previously-described insulating region 52.

Figure 8:
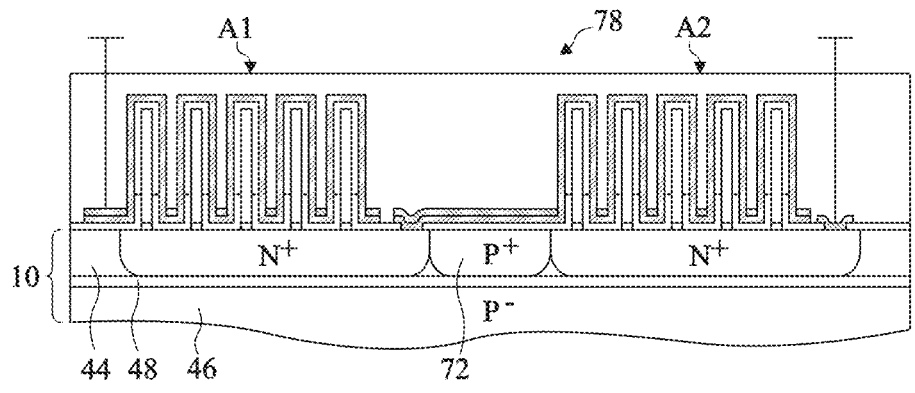

FIG. 8 is a cross-section view of an optoelectronic device 78 according to another embodiment. Optoelectronic device 78 comprises all the elements of optoelectronic device 72, with the difference that substrate 10 has a previously-described SOI-type structure. As a variation, heavily-doped P-type region 72 may be absent, regions 14 being separated by a lightly-doped portion of semiconductor layer 44.

Figure 9:
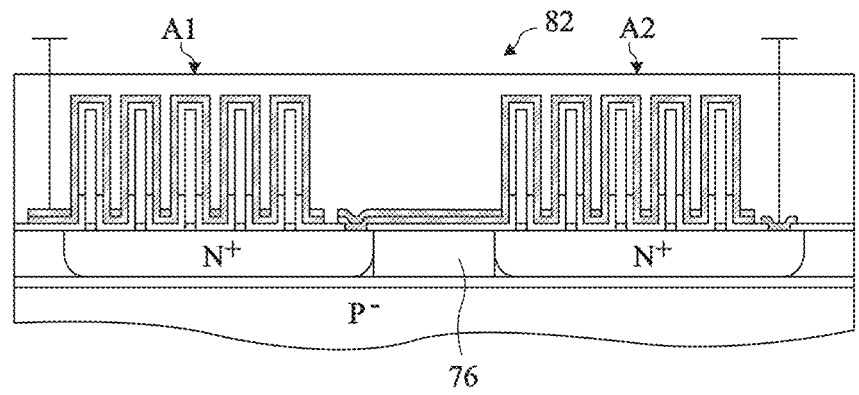

FIG. 9 is a cross-section view of an optoelectronic device 82 according to another embodiment. Optoelectronic device 82 comprises all the elements of optoelectronic device 78, with the difference that heavily-doped region 72 is replaced with previously-described insulating region 76.

In addition to one or a plurality of light-emitting diodes, the optoelectronic device may comprise additional electronic components, particularly diodes, zener diodes, avalanche diodes, MOS transistors and/or bipolar transistors, resistors, metal-oxide-semiconductor capacitances, also called MOS capacitances, metal-insulator-metal capacitances, also called MIM capacitances, thyristors, varactors, volatile memories, for example, dynamic random access memories called DRAM, non-volatile memories, for example, flash memories.

According to an embodiment, the additional electronic components integrated to substrate 10 having the light-emitting diodes formed thereon are used to form a circuit for protecting the light-emitting diodes against electrostatic discharges (ESD).

Figure 10:
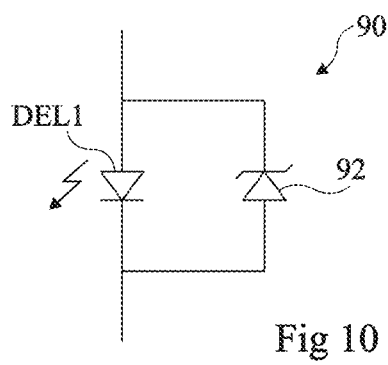
FIGS. 10 and 11 show examples of circuits of protection of a light-emitting diode against electrostatic discharges.
Figure 11:
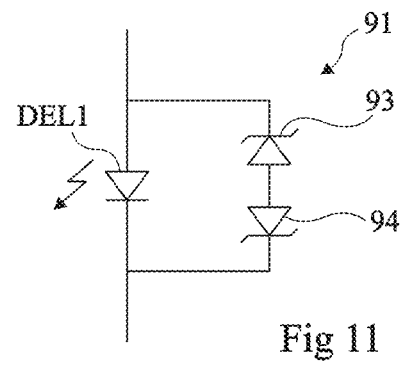

FIGS. 10 and 11 show examples of circuits 90, 91 of protection of a light-emitting diode DEL1 against electrostatic discharges. Light-emitting diode DEL1 may correspond to an assembly of light-emitting diodes assembled in parallel as shown in FIG. 1. Light-emitting diode DEL1 may correspond to an assembly of series-connected light-emitting diodes as shown in FIGS. 5 to 9. Protection circuit 90, 91 is assembled in parallel on the terminals of light-emitting diode DEL1. Protection circuit 90, 91 provides a privileged path to the current when an overvoltage is applied across light-emitting diode DEL1. In FIG. 10, protection circuit 90 comprises a zener diode 92 having its anode connected to the cathode of light-emitting diode DEL1 and having its cathode connected to the anode of light-emitting diode DEL1. In FIG. 11, protection circuit 91 comprises two zener diodes 93, 94 assembled head-to-tail, the anodes of zener diodes 93, 94 being connected to each other as shown in FIG. 11, or, as a variation, the cathodes of the zener diodes being connected to each other. As a variation, protection circuit 90, 91 may comprise one or more than one diode in avalanche.

Figure 12:
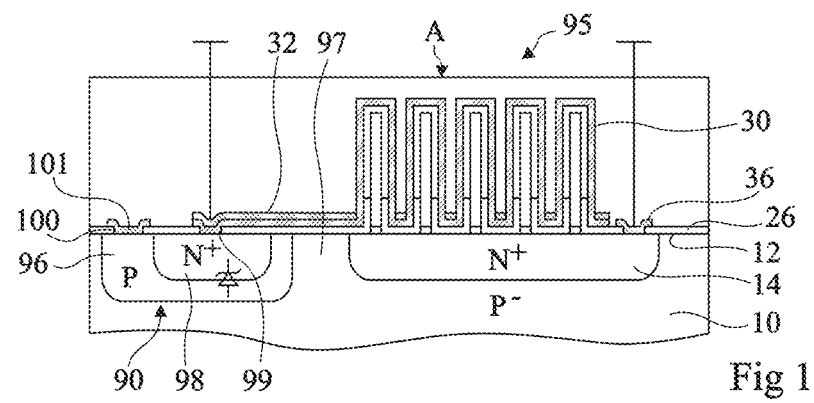
FIGS. 12, 13, and 14 are partial simplified cross-section views of embodiments of an optoelectronic device comprising a protection circuit based on one or two zener diodes.

FIG. 12 shows an optoelectronic device 95 comprising an assembly A of light-emitting diodes such as shown in FIG. 1 and further comprising a protection circuit 90 such as shown in FIG. 10. Optoelectronic device 95 comprises a heavily-doped region 96 of a conductivity type opposite to that of region 14 and separated from region 14 by a lightly-doped portion 97 of substrate 10. Region 96 extends in substrate 10 from surface 12. Optoelectronic device 95 comprises a heavily-doped region 98 of the same conductivity type as region 14 and extending in region 96 from surface 12. Region 96 extends more deeply into substrate 10 than region 98.

An opening 99 is provided in insulating layer 26 to expose a portion of region 98. Electrode 30 and conductive layer 32 extend all the way to opening 99 to come into contact with heavily-doped region 98 through opening 99. An opening 100 is provided in insulating layer 26 to expose a portion of region 96. A conductive pad 101 is provided in contact with heavily-doped region 96 through opening 100. Conductive pad 101 is connected to conductive pad 36 by conductive elements, not shown. N-type region 98 forms with P-type region 96 the zener diode of protection circuit 90.

Figure 13:
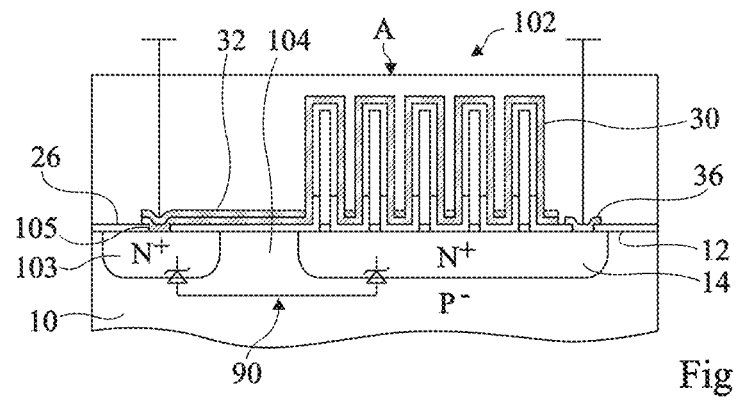

FIG. 13 shows an optoelectronic device 102 comprising assembly A of light-emitting diodes such as shown in FIG. 1 and further comprising a protection circuit 91 such as shown in FIG. 11. Optoelectronic device 102 comprises a heavily-doped region 103 of the same conductivity type as region 14 and separated from region 14 by a lightly-doped portion 104 of substrate 10. Region 103 extends into substrate 10 from surface 12. An opening 105 is provided in insulating layer 26 to expose a portion of region 103. Electrode 30 and conductive layer 32 extend all the way to opening 105 to come into contact with heavily-doped region 103 through opening 105. Regions 14 and 103 are for example formed by the same ion implantation steps or the same epitaxy steps. N-type regions 14 and 103 form with P-type substrate 10 the zener diodes of protection circuit 91.

Figure 14:
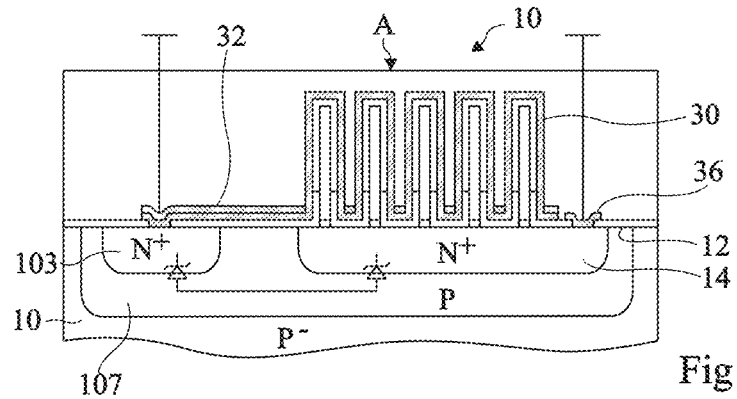

FIG. 14 shows an optoelectronic device 106 comprising all the elements of optoelectronic device 102 shown in FIG. 13 and further comprising a doped region 107 of a conductivity type opposite to that of regions 14, extending from surface 12, and more heavily doped than substrate 10. Regions 103 and 14 extend in region 107. Region 107 extends more deeply into substrate 10 than regions 14 and 103. N-type regions 14 and 103 form with the P-type region the zener diodes of protection circuit 91.

In the previously-described embodiments, the or the plurality of regions 14, 96, 98, 103, 107 may be obtained by one or a plurality of steps of dopant implantation into substrate 10 or by growth by selective epitaxy of the doped material on an initial support. In the case where regions 14, 96, 98, 103, 107 are obtained by one or a plurality of steps of dopant implantation into the substrate, they may be formed before or after the forming of wires 20.

According to an embodiment, the additional electronic components integrated to substrate 10 having the light-emitting diodes formed thereon are used to at least partially form a circuit for detecting the temperature of the light-emitting diodes.

Figure 15:
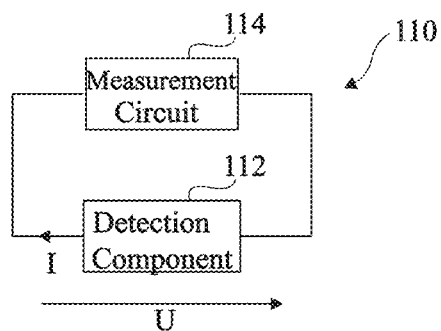
FIG. 15 shows an example of a temperature measurement circuit.

FIG. 15 schematically shows the operating principle of a temperature detection circuit. Circuit 110 comprises an electronic detection component 112 and a circuit 114 for measuring voltage U across component 112 and/or current I flowing through component 112. The operating characteristics of detection component 112 vary according to temperature so that voltage U for a constant current I or current I for a constant voltage U varies when the temperature in the vicinity of detection component 112 varies. Detection component 112 may comprise at least one diode or at least one bipolar transistor having its base and its emitter (or collector) connected in common.

According to an embodiment, at least detection component 112 is integrated to substrate 10 in the vicinity of assembly A of light-emitting diodes. Measurement circuit 114 may be formed by an electronic circuit separate from the optoelectronic device or be totally or partly integrated to substrate 10. Detection component 112 being located close to the light-emitting diodes, particularly at less than some hundred micrometers, typically some ten micrometers, the temperature measured by measurement circuit 114 is representative of the real temperature at the level of the active layer of the light-emitting diodes. This does not occur when detection component 112 belongs to a circuit which is distinct from the optoelectronic circuit. Indeed, detection component 112 is then located several hundred micrometers away from the light-emitting diodes.

Figure 16:
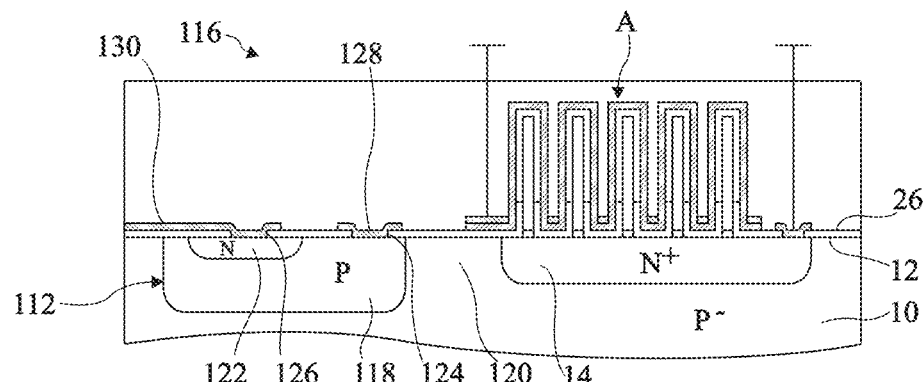
FIG. 16 is a partial simplified cross-section view of an embodiment of an optoelectronic device with microwires or nanowires, further comprising a temperature detection diode.

FIG. 16 shows an optoelectronic device 116 comprising an assembly A of light-emitting diodes as shown in FIG. 1 and further comprising a temperature detection component 112. Optoelectronic device 116 further comprises a P-type heavily-doped region 118 more heavily-doped than substrate 10, separated from region 14 by a lightly-doped portion 120 of substrate 10. Optoelectronic device 116 further comprises an N-type doped region 122, extending from surface 12 into P-type region 118. Regions 118 and 122 form a P-N junction which forms the temperature detection diode. An opening 124 is provided in insulating layer 26 to expose a portion of region 118 and an opening 126 is provided in insulating layer 26 to expose a portion of region 122. A conductive track 128 comes into contact with region 118 through opening 124 and a conductive track 130 comes into contact with region 122 through opening 126. As a variation, region 118 may be N-type doped. In this case, region 122 is P-type doped. Temperature detection component 112 may be insulated from assembly A of light-emitting diodes by one of the insulation structures previously described in relation with FIGS. 6 to 9.

Figure 17:
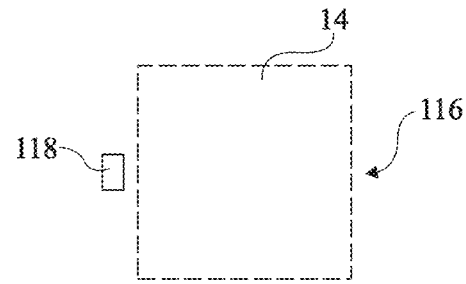
FIGS. 17, 18, and 19 are partial simplified top views of optoelectronic devices showing arrangements of the light-emitting diodes and of a temperature detection diode.
Figure 18:
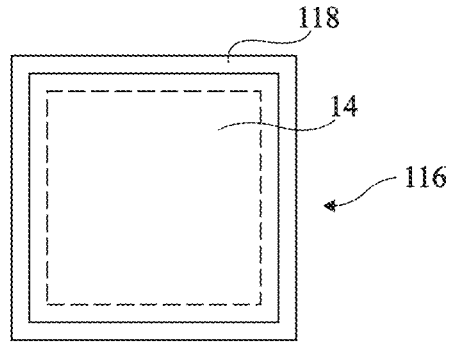
Figure 19:
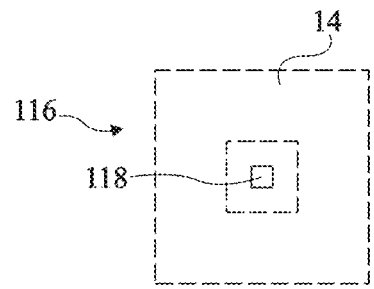

FIGS. 17 to 19 show simplified top views of optoelectronic device 116 where the contour of region 14 having assembly A of light-emitting diodes formed thereon has been shown with a short-dash line and where the contour of region 118 having detection component 112 formed thereon has been shown with a continuous line.

In FIG. 17, detection component 112 is arranged along an edge of assembly A of light-emitting diodes. In FIG. 18, detection component 112 is arranged all around assembly A of light-emitting diodes. The signal measurement by measurement circuit 114 then advantageously enables to determine the average temperature at the periphery of assembly A of light-emitting diodes. In FIG. 19, assembly A of light-emitting diodes is arranged around detection component 112. The temperature sensor may for example be used to regulate the current flowing through the light-emitting diodes to avoid degrading their characteristics.

According to an embodiment, the additional electronic components integrated to substrate 10 having the light-emitting diodes formed thereon are used to at least partially form a circuit for controlling the light-emitting diodes.

As an example, the control circuit may comprise an A.C./D.C. current converter receiving an A.C. voltage, for example corresponding to the A.C. voltage of the mains, and delivering a D.C. voltage which may for example be applied between electrode 30 and region 14. As an example, the control circuit may comprise a voltage rectifier, a switch, or a current regulator which may for example comprise an operational amplifier.

As an example, the control circuit is a circuit for delivering current or voltage pulses used to power the light-emitting diodes. This enables to decrease heating effects in the light-emitting diodes for the same mean power consumption. The frequency and the duration of the pulses are determined so that an observer perceives a continuous light signal due to the persistence of vision, for example, by using a pulse width modulator (PWM).

As an example, the control circuit may comprise a thermal protection module, which is for example formed by a temperature measurement circuit such as previously described in relation with FIGS. 15 to 19, associated with a PWM circuit delivering voltage or current pulses having their duration modulated according to the measured temperature, for example by using a feedback loop which may implement an operational amplifier. As an example, the duration of the pulses of the electric signal may be decreased when the measured temperature exceeds a predefined value, for example 125° C. The thermal protection circuit is for example formed by a temperature measurement circuit, such as previously described in relation with FIGS. 15 to 19, associated with a switch enabling to cut off the electric signal when the measured temperature exceeds a predefined value, for example, 130° C. The thermal protection circuit is for example formed by a temperature measurement circuit such as previously described in relation with FIGS. 15 to 19, associated with a current regulator delivering a current having an intensity depending on the temperature measurement.

All or part of the electronic components used to form the control circuit may be formed on the same substrate 10 having the light-emitting diodes formed thereon. These electronic components may particularly comprise bipolar transistors.

Figure 20:
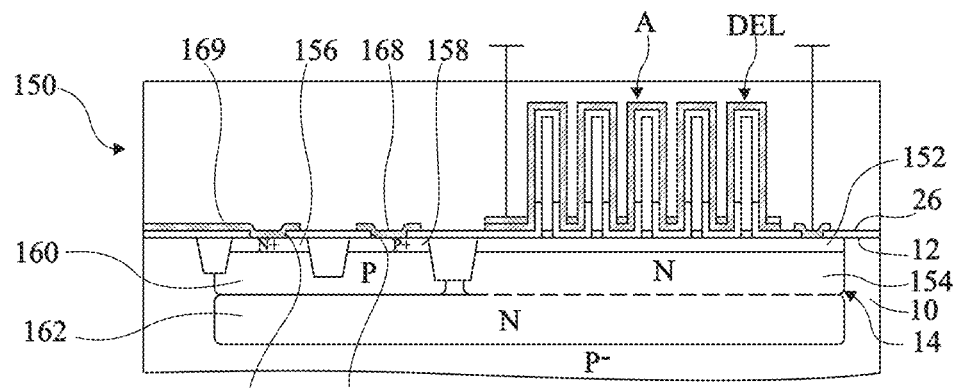
FIGS. 20 and 21 are partial simplified cross-section views of embodiments of an optoelectronic device with microwires or nanowires, further comprising a bipolar transistor.

FIG. 20 shows a cross-section view of an optoelectronic device 150 comprising an assembly A of light-emitting diodes such as shown in FIG. 1, with the difference that region 14 comprises a first N-type doped region 152 which extends from surface 12 and a second N-type doped region 154, less heavily doped than region 152 and more heavily doped than substrate 10, and which extends under region 152. Optoelectronic device 150 further comprises a heavily-doped N-type region 156 extending into substrate 10 from surface 12 and a heavily-doped P-type region 158 extending into substrate 10 from surface 12. A P-type doped region 160 extends under regions 156 and 158 and connects these regions. Region 160 is less heavily-doped than region 158 and more heavily-doped than substrate 10. An N-type doped buried region 162 extends under region 160 and region 154 and connects these two regions. An opening 164 is provided in insulating layer 26 to expose a portion of region 158 and an opening 166 is provided in insulating layer 26 to expose a portion of region 156. A conductive track 168 comes into contact with region 158 through opening 164 and a conductive track 169 comes into contact with region 156 through opening 166.

Region 156 forms the emitter or the collector of the bipolar transistor and region 158 forms the base of the bipolar transistor. Region 162 forms the collector or the emitter of the bipolar transistor and is connected, in the present embodiment, to the cathode of light-emitting diodes DEL.

Figure 21:
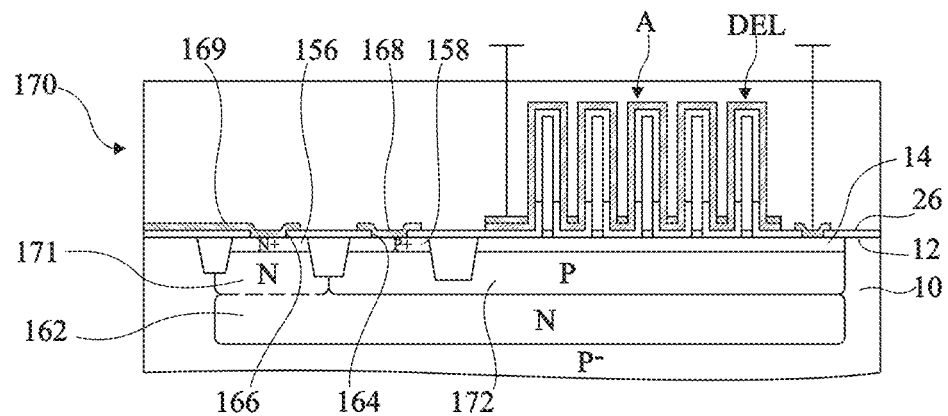

FIG. 21 shows a cross-section view of an optoelectronic device 170 comprising all the elements of optoelectronic device 150 shown in FIG. 20, with the difference that regions 160 and 154 are replaced with a doped region 171 of the same conductivity type as region 162 and extending between region 156 and region 162 and a doped region 172 of the same conductivity type as region 158 and extending between regions 158, 14, and 162.

Region 156 forms the emitter or the collector of the bipolar transistor and region 158 forms the base of the bipolar transistor. Region 14 forms the collector or the emitter of the bipolar transistor and is connected, in the present embodiment, to the cathode of light-emitting diodes DEL.

In optoelectronic device 150 shown in FIG. 20, the P-N junctions of the bipolar transistor are located substantially under regions 156 and 158, while in optoelectronic device 170 shown in FIG. 21, the P-N junctions of the bipolar transistor are mainly located under region 14.

Figure 22:
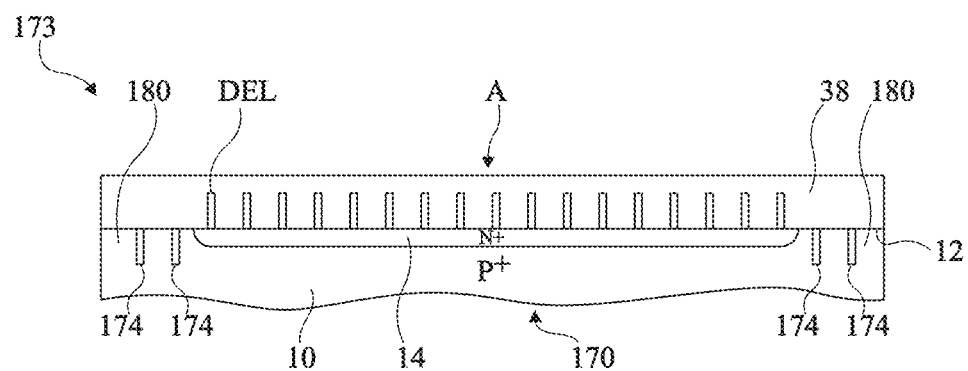
FIG. 22 is a partial simplified cross-section view of an embodiment of an optoelectronic device with microwires or nanowires formed on a substrate wafer before sawing of the substrate.
Figure 23:
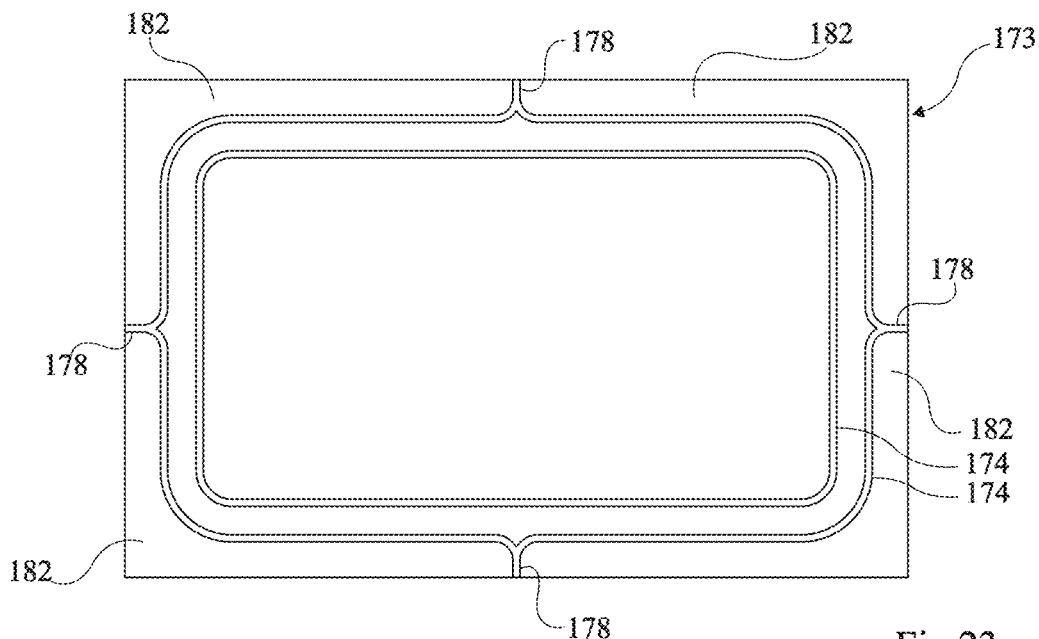
FIG. 23 is a partial simplified top view of the optoelectronic device of FIG. 22.

FIGS. 22 and 23 respectively are a cross-section and a top view of an embodiment of an optoelectronic device 173 with wires.

Optoelectronic device 173 comprises at its periphery two trenches 174 filled with an insulating material which extend across a portion of the thickness of substrate 10 from surface 12. As an example, each trench has a width greater than 1 µm, for example, approximately 2 µm. The distance between the two trenches 174 is greater than 5 µm, for example, approximately 6 µm. Trenches 174 provide a lateral electric insulation of optoelectronic device 173.

As shown in FIG. 23, additional trenches 178 project from external peripheral trench 174 all the way to the lateral edges of optoelectronic device 173. After the sawing, a portion 180 of substrate 10 remains at the periphery of each optoelectronic device 170, 172. Trenches 178 enable to divide peripheral portion 180 into a plurality of insulated segments 182. This enables to decrease short-circuit risks in the case where conductive elements would come into contact with these segments.

Specific embodiments of the present invention have been described. Various alterations and modifications will occur to those skilled in the art. Further, although, in the previously-described embodiments, each wire 20 comprises a passivated portion 22, at the base of the wire in contact with one of seed pads 16, passivated portion 22 may be absent.

Further, although embodiments have been described for an optoelectronic device for which shell 28 covers the top of the associated wire 20 and a portion of the lateral sides of wire 20, it is possible to only provide the shell at the top of wire 20.

Various embodiments with different variations have been described hereabove. It should be noted that those skilled in the art may combine various elements of these various embodiments and variations without showing any inventive step. In particular, the structure of region 14 shown in FIG. 20 comprising a heavily-doped region 152 and a less heavily-doped region 154 may be used with the other embodiments, particularly described in relation with FIGS. 1 to 9, 12 to 14 and 16.

The invention claimed is:

1. An optoelectronic device comprising:
a semiconductor silicon substrate, non-doped or doped to be of a first conductivity type;
a first doped semiconductor silicon region, extending inside of the substrate or on top of the substrate in contact with the substrate, the first doped semiconductor silicon region, when the substrate is non-doped, being of a first conductivity type or, when the substrate is doped to be of the first conductivity type, being of the first conductivity type or of a second conductivity type opposite to the first conductivity type, and more heavily doped than the substrate, the first doped semiconductor silicon region comprising a face;
seed pads or a seed layer in contact with the first doped semiconductor silicon region such that the seed pads or seed layer rest on the face;
a first plurality of first light-emitting diodes supported by the first doped semiconductor silicon region, each light-emitting diode in the first plurality of light-emitting diodes comprising a semiconductor element, mainly made of a III-V compound, having a wire, conical, or tapered shape and in physical contact with a respective seed pad of the seed pads or with the seed layer and comprising a respective active layer covering lateral faces of the semiconductor element;
a conductive portion in physical contact with the first doped semiconductor silicon region such that the conductive portion rests on the face; and
an insulating region at least partly extending in the substrate adjacent to the first doped semiconductor silicon region.

2. The optoelectronic device of claim 1, wherein the first doped semiconductor silicon region is obtained by one or a plurality of ion implantation steps.

3. The optoelectronic device of claim 1, wherein the first doped semiconductor silicon region is obtained by a homoepitaxy step.

4. The optoelectronic device of claim 1, further comprising an electrode of the first light-emitting diodes that comprises a first electrode layer, partially transparent to electromagnetic radiation emitted by the first light-emitting diodes, covering each first light-emitting diode the optoelectronic device further comprising a first conductive layer covering the first electrode layer around the first light-emitting diodes.

5. The optoelectronic device of claim 1, further comprising at least one insulating portion extending along at least one lateral edge of the first doped semiconductor silicon region.

6. The optoelectronic device of claim 1, wherein the substrate is monolithic.

7. The optoelectronic device of claim 1, wherein the substrate is divided into a semiconductor layer, containing the first doped semiconductor silicon region, and separated from the rest of the substrate by an insulating layer.

8. The optoelectronic device of claim 1, wherein a dopant concentration of the substrate is smaller than or equal to $1.0 \times 10^{15}$ atoms/cm$^3$ and a dopant concentration of the first doped semiconductor silicon region is in the range from $5 \times 10^{16}$ to $2 \times 10^{20}$ atoms/cm$^3$.

9. The optoelectronic device of claim 1, further comprising at least one electronic component.

10. The optoelectronic device of claim 9, wherein the electronic component belongs to the group comprising a diode, a zener diode, an avalanche diode, a bipolar transistor, a metal-oxide-semiconductor field-effect transistor, a resistor, a metal-oxide-semiconductor capacitance, a metal-insulator-metal capacitance, a thyristor, a varactor, a volatile memory, and a non-volatile memory.

11. The optoelectronic device of claim 1, wherein the seed pads or the seed layer are made of aluminum nitride, of boron, of boron nitride, of titanium, of titanium nitride, of tantalum, of tantalum nitride, of hafnium, of hafnium nitride, of niobium, of niobium nitride, of zirconium, of zirconium borate, of zirconium nitride, of silicon carbide, of tantalum carbo-nitride, of magnesium nitride in $Mg_xN_y$ form, where x is approximately equal to 3 and y is approximately equal to 2, for example, magnesium nitride in form or magnesium gallium nitride, of tungsten, of tungsten nitride, or of a combination of these materials.

12. The optoelectronic device of claim 1, wherein the seed pads or the seed layer are made of a nitride, a carbide, or a boride of a transition metal from column IV, V, or VI of the periodic table of elements or a combination of these compounds.

* * * * *